US008880366B2

(12) United States Patent
Hampel et al.

(10) Patent No.: US 8,880,366 B2
(45) Date of Patent: Nov. 4, 2014

(54) MODULAR, EXPANDABLE MEASURING DEVICE COMPRISING AN ACCESS-PROTECTED AREA

(75) Inventors: Hermann Hampel, Grosshabersdorf (DE); Andreas Ossig, Nuremberg (DE); Xianglong Yin, Berlin (DE)

(73) Assignee: iAd Gesellschaft für Informatik, Automatisierung und Datenverarbeitung mbH, Großhabersdorf (DE)

( * ) Notice: Subject to any disclaimer, the term of this patent is extended or adjusted under 35 U.S.C. 154(b) by 589 days.

(21) Appl. No.: 13/148,445

(22) PCT Filed: Feb. 9, 2010

(86) PCT No.: PCT/EP2010/000843
§ 371 (c)(1),
(2), (4) Date: Aug. 8, 2011

(87) PCT Pub. No.: WO2010/091860
PCT Pub. Date: Aug. 19, 2010

(65) Prior Publication Data
US 2011/0313694 A1    Dec. 22, 2011

(30) Foreign Application Priority Data
Feb. 9, 2009   (DE) .......................... 10 2009 008 125

(51) Int. Cl.
G01R 21/00      (2006.01)
G01R 22/06      (2006.01)
G01D 4/00       (2006.01)

(52) U.S. Cl.
CPC ............. *G01D 4/008* (2013.01); *G01R 22/066* (2013.01); *Y02B 90/247* (2013.01); *Y04S 20/50* (2013.01); *G01R 22/065* (2013.01)
USPC .......................................................... 702/62

(58) Field of Classification Search
CPC combination set(s) only.
See application file for complete search history.

(56) References Cited

U.S. PATENT DOCUMENTS

| 4,571,691 | A | 2/1986 | Kennon |
| 5,317,250 | A | 5/1994 | Warmerdam |
| 5,523,559 | A | 6/1996 | Swanson |
| 6,825,776 | B2 * | 11/2004 | Lightbody et al. ....... 340/870.02 |
| 7,583,202 | B2 * | 9/2009 | Robinson et al. ........ 340/870.02 |
| 7,930,118 | B2 * | 4/2011 | Vinden et al. .................. 702/64 |
| 8,190,381 | B2 * | 5/2012 | Spanier et al. ................. 702/60 |
| 2006/0091877 | A1 | 5/2006 | Robinson et al. |

FOREIGN PATENT DOCUMENTS

| DE | 20001278 U1 | 6/2001 |
| DE | 202004002731 U1 | 4/2004 |
| DE | 202004019570 U1 | 2/2005 |

(Continued)

*Primary Examiner* — Elias Desta
(74) *Attorney, Agent, or Firm* — Rankin, Hill & Clark LLP

(57) ABSTRACT

Disclosed is a modular, expandable measuring device that includes an access-protected area. In one embodiment, the measuring device is a modular energy meter (EZ), which includes a two-part housing (SA, U) having a detachable connection for holding together the housing parts; at least one internal module (Z, K, IO, IR) arranged in a protected area; at least one external module (EO, ER, EK, EKR) arranged outside of the protected area; and at least one optical interface (OSE, OSI) which is arranged in the internal module (Z, K, IO, IR) and/or in the external module (EO, ER, EK, EKR) and is used for communication, including the detection of the opening of the protected area.

31 Claims, 8 Drawing Sheets

(56) References Cited

FOREIGN PATENT DOCUMENTS

| | | |
|---|---|---|
| DE | 102004040916 A1 | 3/2006 |
| DE | 102005061216 A1 | 6/2007 |
| DE | 102007021138 A1 | 11/2007 |
| DE | 102006055322 A1 | 2/2008 |
| EP | 0494428 A2 | 7/1992 |
| EP | 0961122 A1 | 12/1999 |
| EP | 1593978 A2 | 11/2005 |
| EP | 1672375 B1 * | 7/2013 |
| WO | 2004/021020 A1 | 3/2004 |
| WO | 2006/021119 A1 | 3/2006 |
| WO | 2006/048143 A1 | 5/2006 |
| WO | 2007/071330 A1 | 6/2007 |

* cited by examiner

MODULAR, EXPANDABLE MEASURING DEVICE COMPRISING AN ACCESS-PROTECTED AREA

CROSS-REFERENCE TO RELATED APPLICATIONS

This application is a U.S. national stage of PCT/EP2010/000843, filed Feb. 9, 2010, and claims priority to DE 10 2009 008 125.9, filed Feb. 9, 2009.

BACKGROUND OF THE INVENTION (1) Field of the Invention

The invention relates to a modular, expandable measuring device that includes an access-protected area and, more particularly, to an energy counter with tamper detection and communication interfaces.

(2) Description of Related Art

Nowadays consumption data is recorded on various utility supplies in a household (electric energy, cold water, hot water, air-conditioning, gas, fuel, and other materials of the kind), the meters being located in various measurement points. In all their applications all these utility services, which are collectively called Multi Utility, share the following characteristics:

The need that values that are taken and checked (calibrated) and shown in the invoice should be beyond doubt (in a word, consumer protection);

Values taken locally should be digitized and transferred to a central office to be processed;

The implementation of a fast, timely and customer oriented book-keeping should be conducted as well as Cash Management control; and, The need to create a uniform solution for all kinds of supplying.

Prior technical development of measurement devices and systems for taking combined seizing/reading of consumption data have certain typical weakness and problems such as lack of general validity or single solutions in regard to certain segments. Usually, utility companies like power supply companies or water supply companies prepare consumption reports based on data based on data of customers' counting devices, which most often are installed close to the consumption point. The measurement devices may be for gas, water, electricity, heating, etc., and data provided by them covers previous periods, showing consumption in the relevant consumption point. In principle, data reporting of the counter and, respectively, data reading is made at least once a year for every house, apartment or a consumption point.

Electric meters featuring two or more counters to calculate different rates, whose counters are reset through built-in or external remote control receivers (that are controlled via a central remote control equipment on the premises of energy suppliers) or are switched over through automatic timers, respectively, are utilized for long periods of time. The electronic electric meters developed in the past few years do not contain mechanical elements. For example, energy consumption is measured through a current transformer with a soft-magnetic ring core (respectively, a measurement system with Rogowski coil) with the help of a shunt resistor (Shunt) or a hall element. Energy metering is made through an electronic device, while the result is reported on an alpha-numerical display (most often a liquid crystal display, LCD). Some special (industrial) customers use a different type of counters, as they measure power. In reality, however, counters here are gradually being replaced by electronic ones, reporting the loading, for measuring the active and reactive power (load profile meter). In this way, the rate setting can be changed without contacting the counter; therefore, there is no more need for separate/individual counters in the electric meters.

Readings of some electronic electric meters can be taken remotely from the energy and automation suppliers through the interface. In practice, the interface used represents: an infrared port, S0-interface, M-Bus, potential-free contact e.g. connected to GSM, PSTN modems or PLC modules. At present (April, 2006), in Germany field tests are conducted via an uninterrupted internet connection (DSL). In the United States, electronic electric meters for households are being developed with built-in relays, which, for example, allow them to cut electricity off until the electricity bill is paid, in addition to remote readings taking. In Germany, in the frame from pilot projects intelligent counters become increased usage to introduce Smart Metering technology. Usually, impulse-outputs (S0) are sending consumption-related signals, between 2000 to 5000 impulses per kW/h. Afterwards, depending on the counter, this value should be multiplied by a certain coefficient, for example, 30 or 50, to get the cumulative value.

In the Federal Republic of Germany, electric meters used in trade are subject to calibration duty. Once the calibration term of validity expires (in 16 years, 8 years for electronic electric meters, in 12 years for mechanical induction electric meters i.e. with a rotor disk, respectively), the measurement device should be changed or the term of validity extended.

For example, from WO 2006/048143 A1 a device is known which is able in a reliable and energy-saving way to detect manipulations on the housing of household electric meters without using mechanically triggered buttons or magnetic and photoelectric switches. In particular, this device envelops a part of the body where the electronic receiver is placed, as well as a second, separate from the first, part of the body, with the first part being secured against illegal removal of the second part. An electrical resonant circuit is envisaged in the first part of the body, and this circuit is made of spool and a capacitor, while the spool emits signal through the metal element placed in the second part of the body when the distance between the spool and the metal element changes. This signal is directed to the electronic plate in the first part of the body and assists further processing. In order to find that the second part of the body is parted from the first one, which determines the change of quality of the spool within the resonant circuit, absorption power of the oscillation of the resonant circuit decreases along with the continuation of the electric switch's reverse pulse. The device's electric resonant circuit is mounted close to a low energy consuming interrupt. A very short, low energy, voltage pulse is enough to feed this resonant circuit. If the excitation occurs concurrently at a relatively low frequency, e.g. once every 10 seconds, a low average power of the control circuit is achieved, allowing a device featuring primary or secondary batteries or high capacity capacitors to run for a very long period. The continuation of the reverse impulse is directly related to the absorption power of the oscillations of the resonant circuit and is calculated using a microprocessor circuit.

Such a protection against unauthorized manipulation is known from WO 2004/021020 A1. It applies to a counter body with a sealed cap that covers counter terminals, where at least one of the additional devices is covered, i.e. is secured against unauthorized access through a second seal. The seal of the second measuring device that needs protection is designed in a manner that is freely accessible when there is no cap to the terminal box, enabling easy and fast inspection. Therefore, the body of the electric meter is equipped with at least one hoop on the seal, connecting the hole for the seal to the additional cover, with the seal's locking-finger functioning as a connecting element of at least one hoop and one hole. It is very advantageous when at least one hoop is placed at a distance from the hole for the seal, so that the breaking point of the locking-finger is visible, especially in the case of transparent locking-fingers.

Also, adapters or carrying panels for electronic home meter (shortly, eHZ) are known, on their fixing sides are arranged external terminals protruded down which are connected with suitable contact appliances. In this manner, a change of electric meter or new mounting can be implemented, and it will not be necessary for the user's power supply to be interrupted. As a rule, these platforms are present in positions of delivery, mounting or operation. Users can try to change, even for a while, the platform from operation position to a installation position so that the electric current consumed by them not to be read by the counter. Also, consumers whose electric meter has been taken down and the platform has changed into a position of delivery, can try to change the platform from position of delivery to mounting position in order to consume electric current from the network in an unauthorized manner without paying for it. In order to prevent in practice unauthorized usage of electric energy even with removed sealing appliance between the counter and the platform, according to DE 10 2006 055 322 A1 a system is known for energy meter with circuit-interrupt mechanism and receiving platform with a device for detecting when moving. In this case the circuit-interrupt mechanism interacts with the device for detecting when moving in such a manner that when moving the counter over the platform from an operation position into a position of installation, the circuit-interrupt mechanism interrupts permanently the power supply to the energy meter. The circuit-breaking mechanism can be equipped, for instance, with a disconnecting circuit-interrupt with switching lever for its manually switching on and off, as well as with a block system that is arranged in such a manner that when released, the disconnecting circuit-interrupt is opened (main emergency circuit-interrupt, line protecting circuit-interrupt) and its closing by the switching lever is not possible. Alternatively, the mechanism for circuit-interrupt can be equipped with a mechanism for disconnecting by force (a mechanism for operating current switching off, accessory driving mechanism) which through a device for detecting when moving can be changed from a position of switching on into a position of switching off and which interacts with the blocking system of the disconnecting circuit-interrupt in such a way that it is unblocked in a position of switching off the mechanism for disconnecting by force. The interrupt of power supply can be achieved only through a special restarting device. Besides, the device for detecting when moving comprises a terminal switch or photoelectric switch (energy meter clamping braces) that are connected or are driven in such a manner that a recognition signal for moving to be sent to the circuit-interrupt mechanism in case that the energy meter is changed from operation position into a position of installation. Furthermore, the device for detection when moving comprises a delay device (delaying the recognition signal when moved for a few minutes) so the technician shall have enough time to replace the energy meter without interrupting the power supply by the main emergency circuit-interrupt. And finally, the recognition signal when moving can be transferred through a remote device to the mechanism for interrupting from and to remote places. For this purpose, as a remote device a modem connection via a telephone line can be used.

In order to make possible an unambiguous, automatic and faultless attachment to the respective place for recording and data reading when using carrying panels (installation elements, installation facilities) and the recording and data reading changeable device, fixed on them, from DE 10 2007 021 138 A1 a recording device is known with at least an electronic fuse or with a seal. In particular, the installation element comprises at least one information device with permanent memory for storing the identified information and/or data from the installation element and/or place where the information is recorded. The recording device comprises at least a device for these data reading. It is preferable that the information device is formed as a RFID-TAG, which is implemented in such a manner that when opening the access-protected area, unpreventable destruction of the seal occurs, i.e. destruction of one of the essential functional elements of this information device. This state is recorded by the reading device, is stored in the recording device and/or data transfer to the central controlling or data recording block is implemented. By the way, the recording devices are sensors or controlling devices of a control system but mainly they are counting devices and in particular, energy consumption counting devices. Inside the housing of the counting device there is at least one access-protected area. The housing can be opened by authorized persons, consists of two parts, connected with each other. For sealing, respectively safeguarding the internal housing area, on its external side at least one electronic seal has to be placed and it has to cover the transition between these two parts. The protection removal from the housing and/or opening the housing is not possible without destroying one of the essential functional elements of the electronic protection, for example destroying the antenna structure and/or integrated board for switching RFID-TAG. This fact also can be transferred immediately to the central controlling or data recording block. RFID-TAG can be arranged in a partition of the installation element—for example built-in or cast—or can be arranged at or in a housing partition.

To reduce the numbers of variants of the recording device, from DE 20 2004 002 731 U1 an adapter is known to the energy meter with at least one integrated measuring current and voltage transformer. Each measuring current and voltage transformer is constructed in such a way that to be suitable for connecting on the one part, to a measuring transformer in the user's connection point to the network, and on the other hand, to an energy meter. The secondary current of the measuring current transformer (second transformer) runs in the energy meter, respectively in the electric current sensor of the energy meter (this current can be referred to as tertiary current). The tertiary current can be measured through the ratio of the coil number in the transformer so, that the measuring transformer primary current to be equal to the tertiary. In this manner an electronic home energy meter can be installed whose functional range is equal to the conventional, directly connected transformer for industrial appliances. In this way, it is preferably that an energy meter to be placed, the best of all with an option to record transmission load for active and reactive energy measurement (load profile meter) that is designed for direct connection to the power supply line in the connection point, respectively is specified as an eHZ-technology. If an energy meter has to be replaced, it can be taken down in the same manner as it is switched off and the new one to be connected easily in the same manner.

Furthermore, from DE 10 2005 061 216 A1 a consumption counter is known, more precisely a consumption reporting device for heating, water or gas which comprises a main device and a separate module for data transfer to and from the main device. In particular, to the individual number of the main device a freely chosen by the user user's name can be added and under this name the data from the main device and the separate module can be read. This means that after replacement of the main device, for example because of the calibration term of validity expires, no changes for reading the consumption must be undertaken. For the main device and separate module a record for data replacement is drawn up where in a completely automatic way the same name and data are set and where the data transfer between the main device and separate module is bi-directional. The same applies when the module replacement has to be done with more advanced because of the increased requirements. Besides, the module comprises a connection for external bus, more particular M-bus that can be connected wireless or via a cable. In this case the module interface to the main device is identical with the wireless connection interface and this makes the module switching on "transparent", i.e. an external block can access directly the main device, e.g. in case of technical servicing, new programming, etc. In case that a heat counting device is present, a metering block reports the consumption and this is based on the measured values entered to the sensors. In this case the correcting values stored in the memory serve for the precise main device count to be obtained. The metering and storing block are supplied by a battery whose capacity should be great enough to supply the main device during the whole five-year period of calibration validity. The main device comprises all the components needed for calibration and a data interface, eventually an energy interface, e.g. by an induction coil or connected through a capacitive board or via a cable, for example also an interrupt-generator.

Furthermore, from US 2006/0091877 A1 a device is known for electric energy reading with a microprocessor core which comprises also the function of tamper detection. The tamper detection is based on a tamper sensor usually it is a switch (opening detector). Therefore, in case with US 2006/0091877 A1, certain means are always required, namely sensor, switch, impedance detection board, etc. and in the last case also additional protection for variable peaks of overvoltage (through resistors and diodes). As external modules only a service module is stated, e.g. portable reading device, wirelessly connected to the energy counter, (optional) external memory (with expanded options) and a relay for external device switching on.

And finally, from U.S. Pat. No. 4,571,691 a device is known for valuable energy measuring, where the tamper detection is implemented through control over a separate transmission line, where upon removing the bolts or when removing, respectively moving the fixing ring (e.g. which is needed for housing cap removal), irreversible switching off occurs. In this case the disadvantages are that it requires, firstly: a separate transmission line (e.g. optical fibres) and secondly: specific installation of this line that increases expenses during the implementation.

That is, from the technical point of view different systems are known for tamper detection on the part of the end user/customer, in particular, through sealing the housing cap (e.g. WO 2004/021020 A1) or electronic seal (electric resonant circuit as per WO 2006/048143 A1 or RFID as per DE 10 2007 021 138 A1). In principle, the devices of power supply companies are equipped in such a way that the consumption data from the consumption point (i.e. end user, e.g. in the household but also in the industry and public sector) are reported as easily as possible and at advantageous rates (resource counters, e.g. energy meters and water meters) and are transferred to the power-station in the easiest possible way and at advantageous rates as well (communication methods) where they are processed through automatic reading for the said end users. The user is always the operator, competent to do the measurement, respectively the person doing the measurement service who deals with the delivery of the counter for the relevant resource measuring, installs it for the customer, maintains and reads it; the same applies also to the communicational devices. Lacking in practice, however, is a measuring device/meter which can be used universally, independently of other technical conditions, and which can be expanded/adapted in a simple manner and has at least one access-protected area/space in the housing. This is particularly significant because the industry that produces measurement devices has been regarded as an extremely advanced, development-oriented industry which rapidly takes up and actually implements improvements and simplifications.

BRIEF SUMMARY OF THE INVENTION

It is, therefore, an object of the present invention to design a measuring device/meter having an access-protected area/space in the housing in such a way that it can be extended or converted in a simple manner, without thereby reducing the security, especially protection against unauthorized manipulations.

This problem is solved by a measuring device, in particular modular energy meter, comprising:
 a two-part housing having a detachable connection for holding together the housing parts;
 at least one internal module arranged in a protected area;
 at least one external module arranged outside of the protected area; and
 at least one optical interface which is arranged in the internal module and/or in the external module and is used for communication, including the detection of the opening of the protected area.

The measurement device, according to the invention, has in comparison to prior art the advantages of the simplified implementation of new functions and lower costs for extension or conversion. In this case the system invented consists of several optional modules, i.e. they can be equipped additionally. External and internal modules can be distinguished. The internal modules are these ones that usually are arranged in the sealed part of the measuring device and for that reason they are not accessed by the customer, nor can they be replaced by them (only by the manufacturer or operator). The external modules are these ones that are not arranged in the sealed part of the measuring device and for that reason they are accessed by the customer and can be replaced by them. While using measuring devices, especially such ones for energy counting, the customer is allowed to install additional modules (in this case the customer is not the end user but a buyer of the measuring devices, these are powers supply companies, energy-supply and water-supply companies, etc.). As a whole, it results in cost-effective, compact, flexible and easy for applying solution. The measuring device, according to the invention, can be assembled according to needs, respectively standard variants can be pre-fabricated; if customer's needs change, the additional functional elements can be easily retrofitted. This can be implemented without replacing the counter but through a change or easy installation of new modules, while in the same time blocking the optical transmission line (it allows for the service staff to report the operation) which is unauthorized manipulation protection. An additional advantage is that it does not require for the optical transmission lines to be destroyed what is the case with the prior technical achievements. It is implemented through closing, re-closing the cap/caps (also in case of repair and retrofit through switching connecting cable/light guide between the internal module or replacing the reflector with a light guide and transmitting/receiving diode.

In the preferred embodiment of the invention are disposed in said protected area internal modules, a counter module and a terminal module, whereas the terminal module comprises a terminal block for network connection for connecting the power supply of the internal and/or external modules and for connecting at least a shunt resistor, a transducer or a Rogowski coil.

This embodiment of the invention has the advantage that the terminal block contained in the separate terminal module can perform simultaneously up to four functions, namely:
- Network connection;
- Possibility for contact for the optional module;
- Shunt connection or connection of the transducer, or Rogowski coil; and
- Adapting the PLC-board (integrated in terminals), i.e. interface for the PLC-board to the network.

In a further development of the invention is arranged in said protected area as an internal module an option/retrofit module for communication connection of the meter for bi-directional data communications, especially for remote reading of encrypted data via said terminal module into the power supply network and to a central station is provided.

This elaborated embodiment of the invention has the advantage that through the combined data transmission over wired and wirelessly connected optical lines it can implement communication connection with the counter without reverse action (e.g. through PLC-module (single-phase and three-phase) for WAN-interface, ZigBee, GPRS, etc.) via an optical interface to the counter module for which one-directional and bi-directional communication is used. And finally the optional module/retrofit module can contain AES and signature module (Advanced Encryption Standard) for encrypting the (remote) communication, respectively connection with CPU (microcomputer) with ECC in the counter module for signing/encrypting the (internal) communication).

In a preferred embodiment of the invention in the housing cap formed as a terminal cover a terminal and expansion module is arranged as an external option retrofit module with optical connection to the counter or an internal option/retrofit module or a reflector.

This embodiment of the invention has the advantage that a communication line which already exists and serves for connecting one/more external optional modules can be used as unauthorized manipulation protection. If there exists a corresponding communication module (for retrofit), for unauthorized manipulation protection the communication through a reflector (an advantage in comparison to the prior art is profitable, easy for implementation) can be used.

BRIEF DESCRIPTION OF THE DRAWINGS

Further advantages and details can be gathered from the following description of preferred embodiments of the invention with reference to the drawing, in which shows.

DETAILED DESCRIPTION OF THE INVENTION

Figure 1:
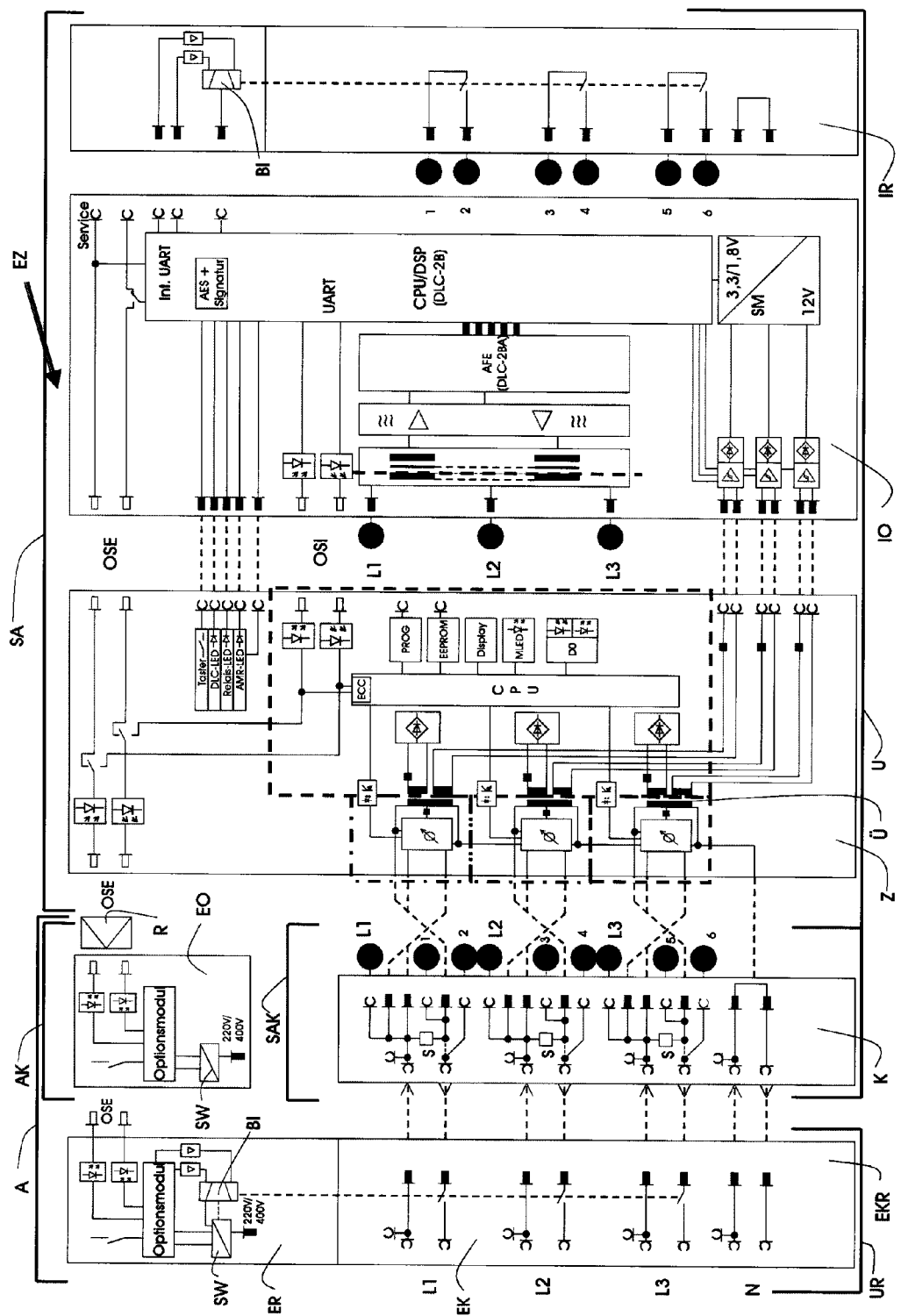
FIG. 1 a block diagram of a measurement device designed as an energy counter with several modules, optional module as well.

FIG. 1 shows a block diagram for a preferred embodiment of the counter EZ, according to the invention, whose control is very easy for the operator and it does not require knowledge related to the data electronic processing. Even later the embodiment of the solution according to the invention to apply to the energy counter EZ with basic functions when recording the measured values and communication in external direction, the concept according to the invention can be applied also to other devices with corresponding interfaces, e.g. for measuring the power supply of solar equipment in the electric network. It owes to the fact that the concept according to the invention is based on the modular structure and relevant possibility for configuring and allows easy adaptation to the defined circumstances and integration without changing the invention, respectively the main concept.

The system according to the invention, as shown in FIG. 1 to FIG. 5, comprises several modules, some of which are optional, i.e. they can be retrofitted. Thereby we distinguish between the internal modules, especially the counter module Z, the terminal module K, the (internal) relay module IR and the (internal) optional module/retrofit module IO, and between the external modules, especially the terminal module and extension module EO, as well as between the terminal and relay module EKR. According to complete structure of the invented counter EZ with all the (optional and retrofit) modules presented in FIG. 1, the terminal module K is not shown as a standard terminal module but with already placed connection for internal terminal module IR as optional extension. In the preferred system embodiment, the counter EZ contains all the modules specified except for the internal relay module IR or the terminal and relay module EKR because it is not reasonably for them to be equipped in the same device.

The counter module Z serves for establishing the counter values (the energy values measured), which are transferred by it via the optical interfaces OSI, OSE to the internal and external optional module IO, EO.

The internal retrofit module IO serves mainly for communication connection of the counter, e.g. for data transmission from the counter to a head office, respectively data collector (remotely reporting of the counter for the measuring service provider), preferably via the PLC-components, in particular DLC-components of the present applicant (refer to FIG. 1 AFE (DLC-2BA and CPU/DSP (DLC-2B)).

The optional module/extension module in the terminal module and the extension module EO, for example is implemented as a radio module (e.g. wireless M-bus, ZigBee) for connecting additional counters in the building via a radio-connection (e.g. a distribution device for heating expenses, water meter), as a PLC-module for internal communication in the building through the electric network and also as interface for devices of other applications (e.g. display, customer interface, serial interface, USB, Ethernet). In thus way a data recording system/a system for management with data transmission via radio-lines and electric distribution networks can be connected—and it is a subject of German patent 10 2006 020 030.6-35 of the present applicant. In this manner it can be used for verifying the counter data, respectively the data from power supply company's invoice.

The internal modules are arranged in the sealed part (hereinafter referred to as protected zone/area GR1, GR1a, (refer to FIG. 8) of the counter EZ, therefore they are inaccessible for the customer, cannot be replaced by him (but only by the manufacturer or operator), whereas the external modules are not arranged in the sealed part of the counter EZ and therefore they are accessible for the customer and they can retrofit with additional modules.

Figure 2:
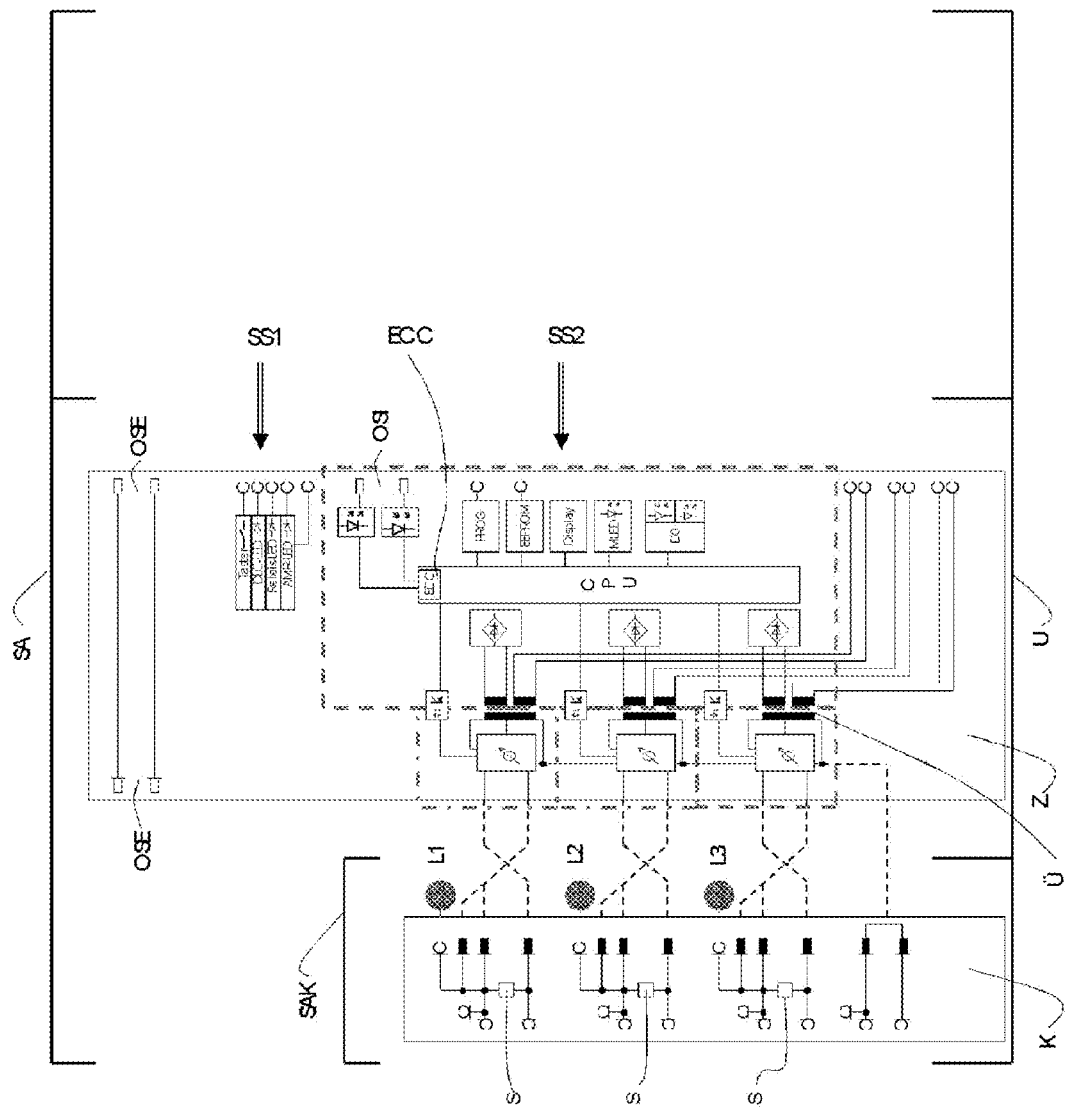
FIG. 2 as an example for implementation: "Standard measuring device" comprising a counter module and a standard terminal module, FIG. 3 an embodiment of the energy counter according to FIG. 1, as an example for implementation of "Standard measuring device" with additional optional internal module and external terminal module and an expanding functions module, FIG. 4 an embodiment of the energy counter according to FIG. 1, as a form of implementation of "Standard measuring device" with additional optional internal module and external terminal module, FIG. 5 one more embodiment of the energy counter according to FIG. 1, as a form of implementation of "Standard measuring device" with any interface module, FIG. 6 a side view in details of the counter module, and the terminal module FIG. 7 a view from above, details of the counter module, and the terminal module according to FIG. 6 and FIG. 8 a side view of schematic diagram for implementation of the counter housing.
Figure 5:
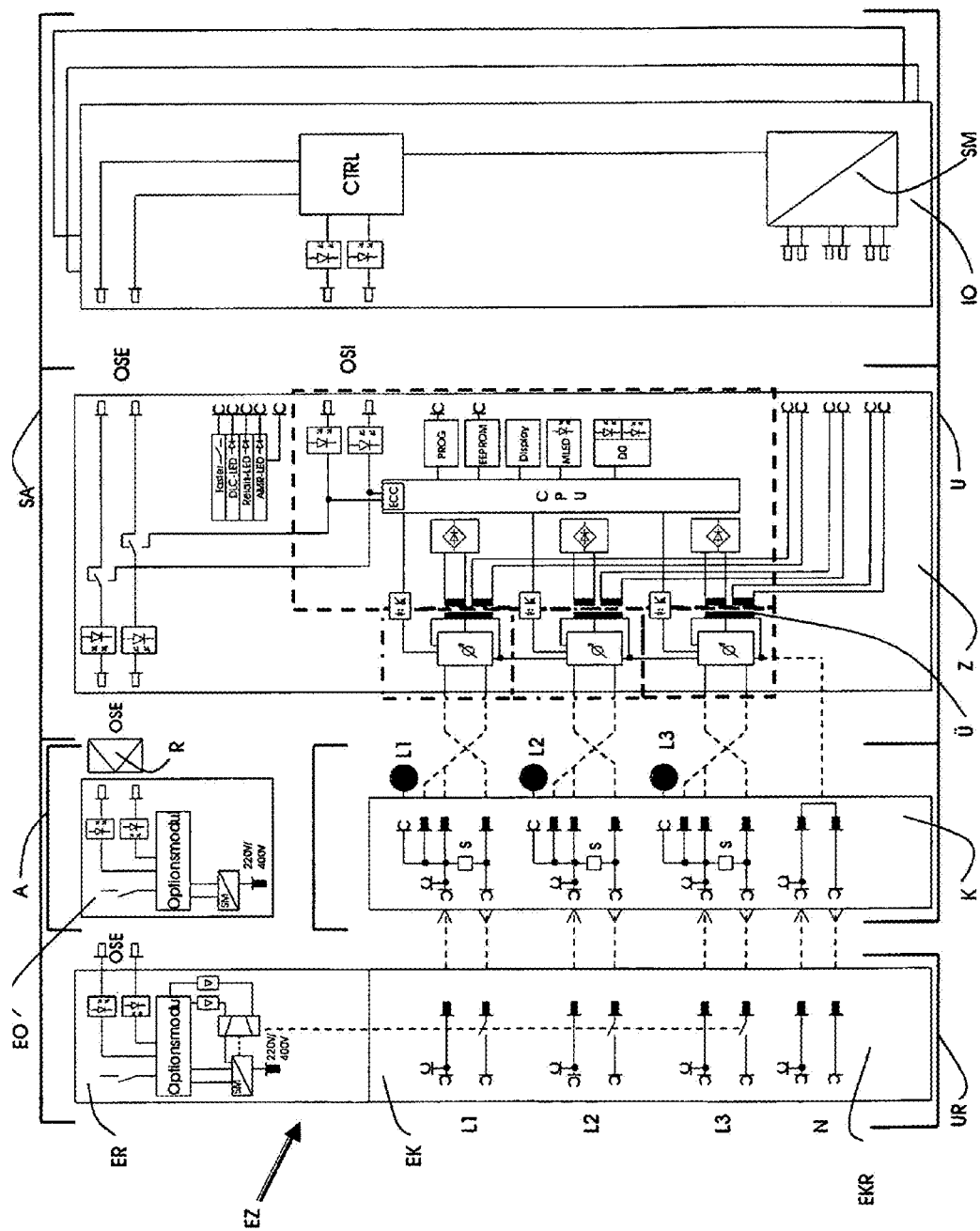
Figure 6:
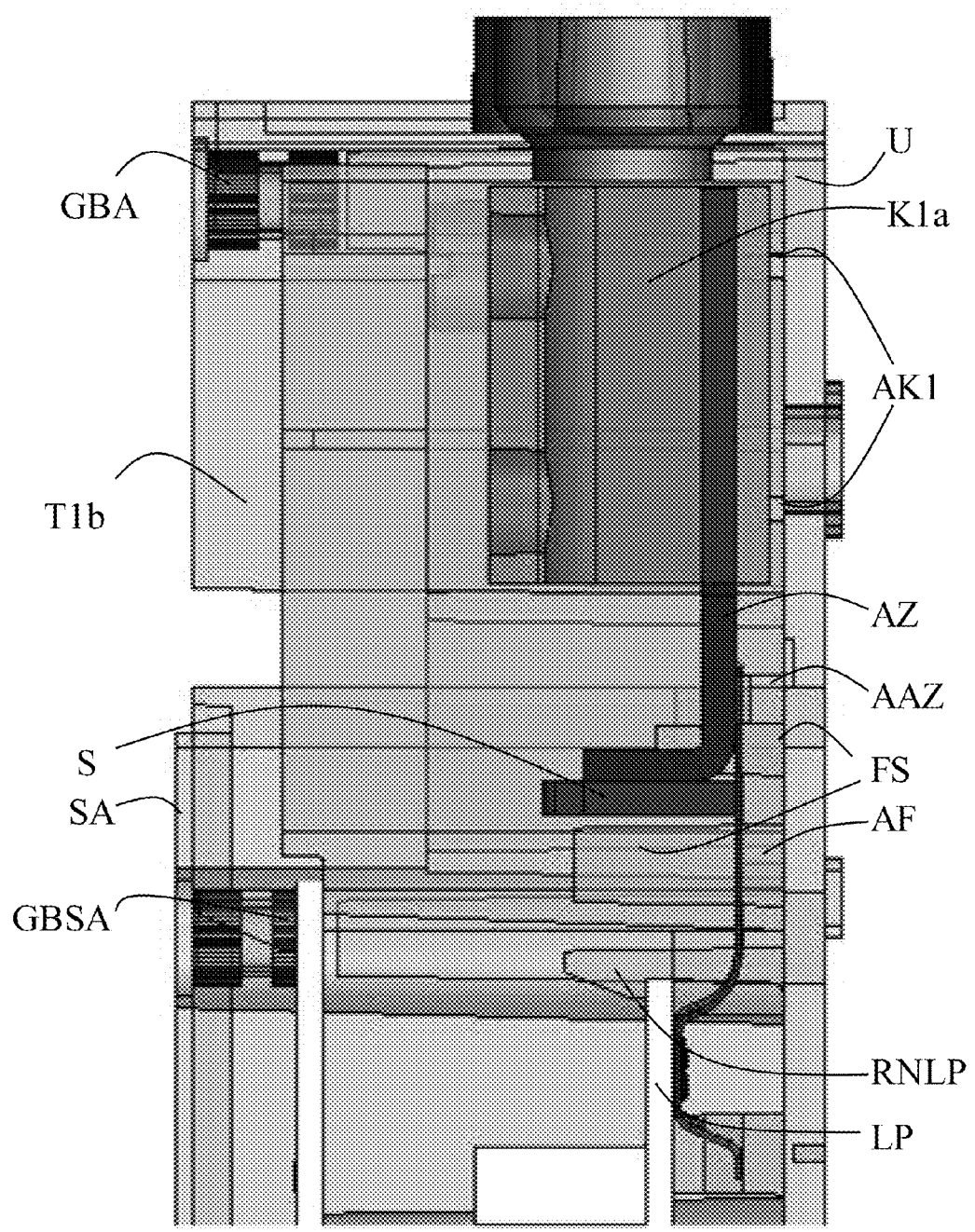
Figure 7:
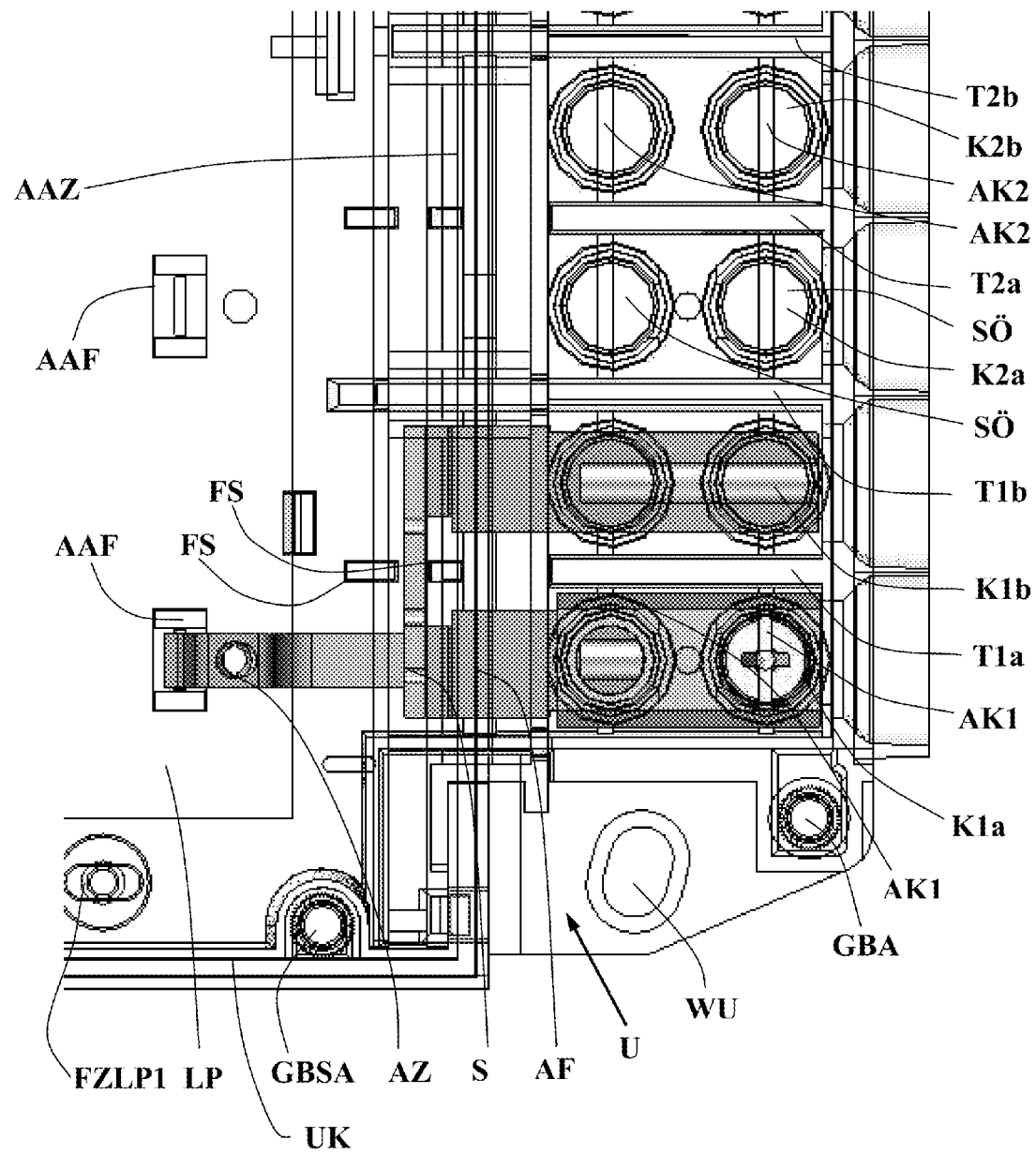

The housing, as it can be seen from FIG. 2, FIG. 6 and FIG. 7, consists of two parts, namely a cap "standard measuring device" SA (implemented as a cap of the housing) and a lower shell of the housing U, with a detachable connection intended to hold together the two parts of the housing SA, U, for integrating "the standard measuring device" comprising the counter module Z and standard terminal module K, covered with a cap SAK (refer to FIG. 1 to FIG. 5). Between the internal modules Z, K, IO, IR and external modules EO, ER, EK, EKR optical interfaces OSE, OSI are arranged which serve also for communication, including for recognition when opening the protected area.

The example for implementation presented in FIG. 2, namely a "standard measuring device" (basic measuring device) consists of a counter module Z and standard terminal module K (terminal block). It, for example, can be extended very easily through an intelligent cap of the terminal box A (with external optional module EO) and can be extended through an external relay (+optional module) ER (in the presented example the optional module serves for data transmission, respectively for controlling the relay). The designations in field SS1 are buttons, DLC-LED, relay-LED and AMR-LED, and the designations in FIELD SS2 are PROG, EEPROM, display, MLED and DO; see the following description of these circuit parts/components.

Figure 3:
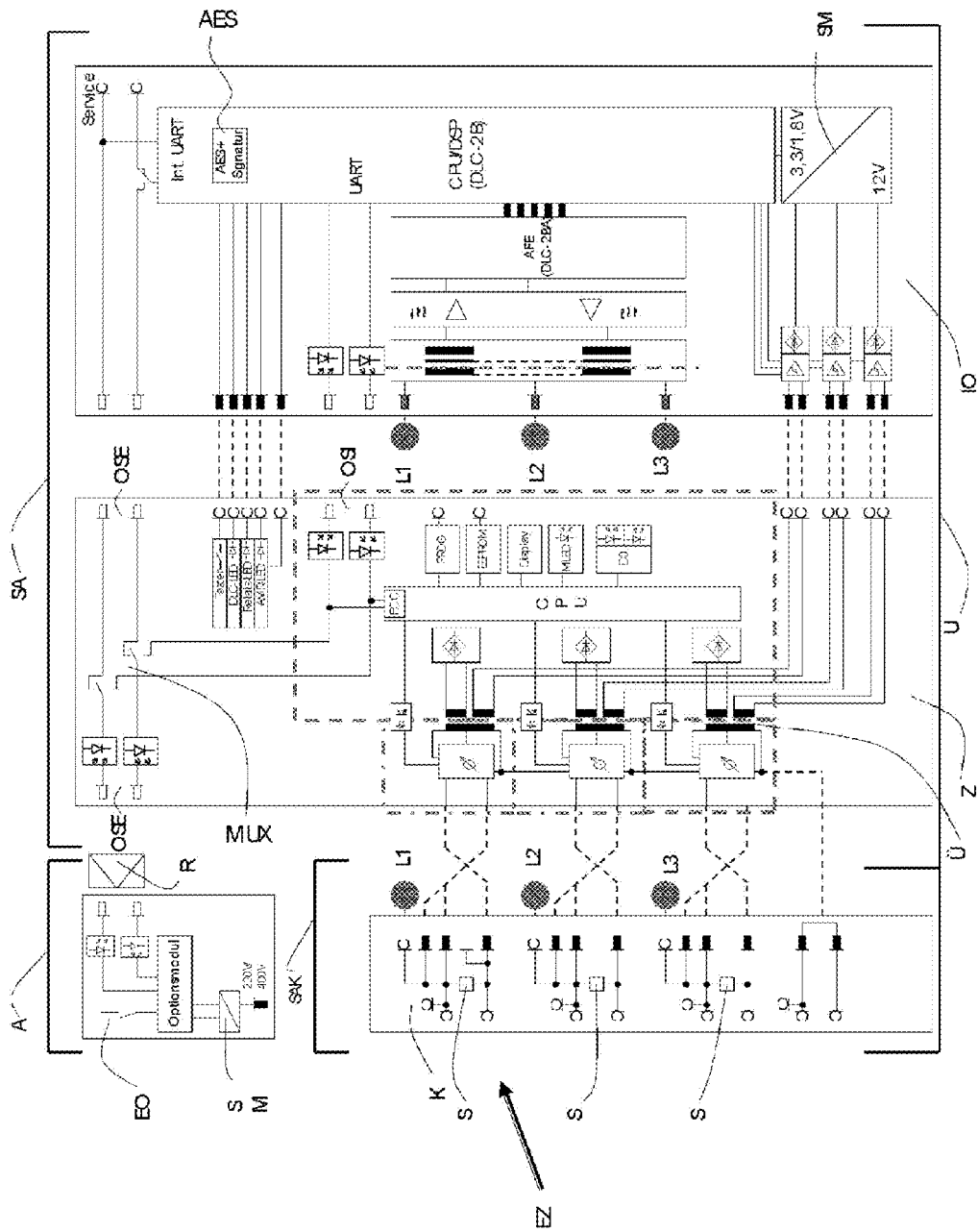
Figure 4:
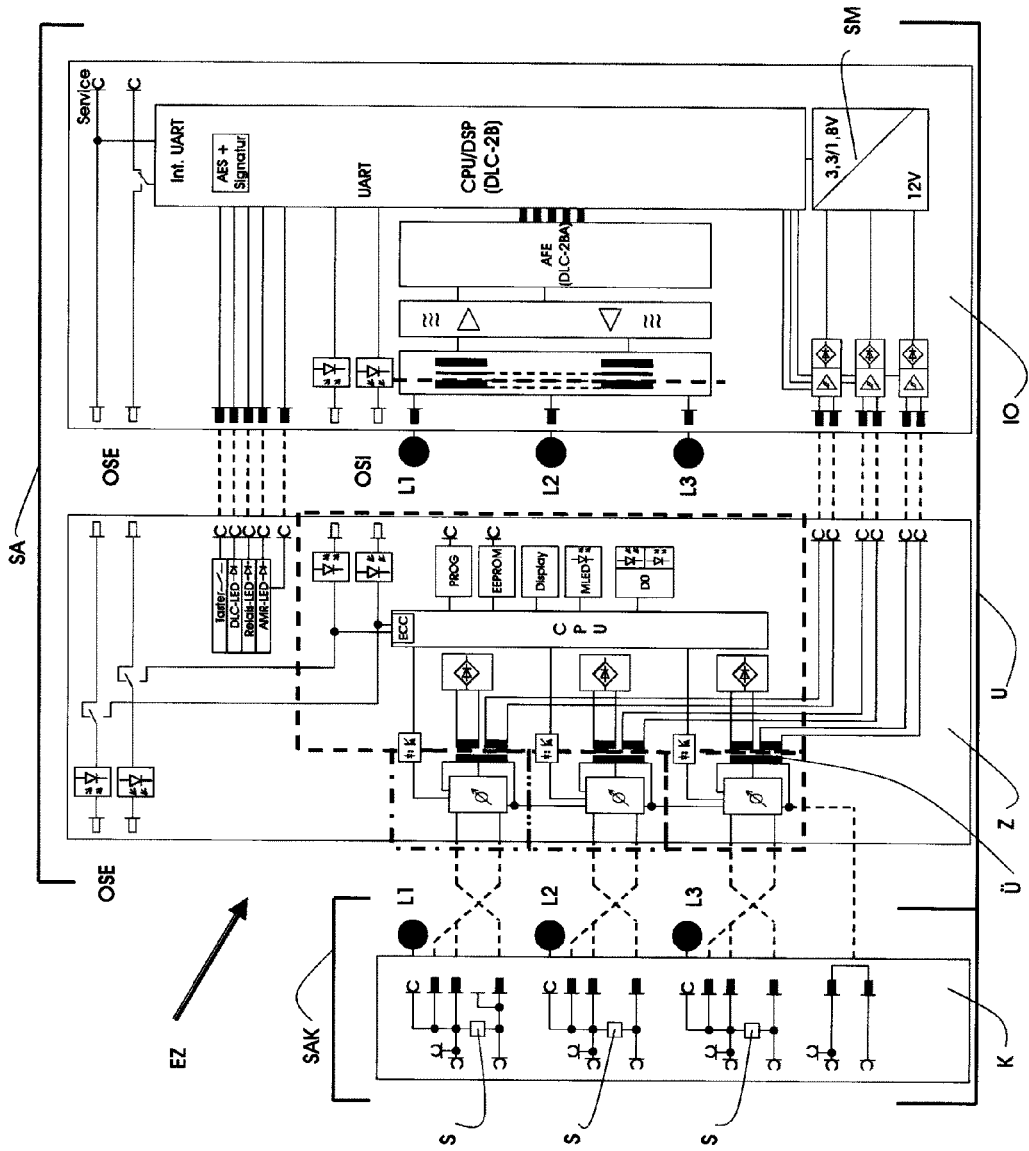

The example for implementation presented in FIG. 3 shows "standard measuring device" with the additional internal module IO (e.g. as PLC-counter, as well as an intelligent cap of the terminal box A (with external optional module EO). It is, for example, very easily extendable through an external relay (+optional module) ER. Thereby the relevant supporting structural elements (including LED, MLED, display, DO, PROG, button, see FIG. 2 numeral SS1 and SS2) and the parallel printed circuit boards arranged one on top of another LP (see FIG. 6 and FIG. 7) can be positioned and fixed by means of locking tabs and the printed circuit board placed on top (not shown in the drawing), and additionally, for example and through the guiding fingers FZLP1 arranged in the four corners, which are protruded over the housing pad.

The example for implementation presented in FIG. 5 shows the counter EZ according to the invention, where the internal optional module IO is presented as any module with the relevant interfaces (mostly OSI, OSE) to the module of the counter Z. These are, according to the needs of the applications subject to implementation, the main interface for the module power supply, optical interface OSI for communication with the module of the counter Z and interface OSE for communication with possibly available optional module EO. As already mentioned, the internal optional module EO can serve as a communicational connection of the counter (e.g.

such as PLC-module (single-phase or three-phase), DSL, GPRS, etc for WAN-interface or M-bus, ZigBee, Ethernet and so on for LAN-interface).

As we shall describe later, initially on the base of the module structure, the terminal module K comprises a terminal block for connection to the network L1, L2, L3, N, for switching the power supply SW on of the internal or external modules IO, IR, EO, ER, EKR and for connection to at least one shunt S. In the protected area, according to the implementation presented in FIG. 1 or FIG. 3, an optional module IO is foreseen as an internal module for communicational connection of the counter EZ for bi-directional data communication, mainly remote recording of encrypted data, via the terminal module K through the power supply network L1, L2, L3, to the head office.

To implement the bi-directional data transmission with an external optional module (e.g. for further communication, via wired or wirelessly), the optional module IO contains an additional optical interface OSE. Switching between optical line is implemented by CPU, arranged in the optical interface OSE, and multiplexer/multiple switch MUX controlled by it. Further for another form of implementation presented in FIG. 1 or FIG. 3, in the protected area as an additional internal module is arranged a relay module IR connected with terminal module K, which comprises a bistable relay BI, controlled by at least one optional module IO which disconnects the end customer from the network L1, L2, L3, N or reduces power through switching off the phases L1, respectively L1, L2.

The counter Z contains transmitter/transformer U, whose primary side is connected with terminal module K and its secondary side, as well as with the controlling device CPU of the counter Z for analyzing, identifying and displaying the measurement signals provided and also with the voltage measuring transformers arranged in the internal or external modules IO, IR, EO, ER, EKR.

For the additional extension of the counter EZ of the terminal block K1a, K1b; K2a, K2b; . . . the relay module ER is installed. Thereby the external relay module ER can contain communicational/optional module and a retrofit module with optical connection OSE to the module of the counter or internal optional module Z, IO. Furthermore, in the housing cap formed as a terminal cover A, a terminal and expansion module EO is arranged as a communicational/optional module and a retrofit module with optical connection OSE to the counter or to the internal optional module Z, IO or reflector R. The reflector R is specially equipped as a prism (closing the optical transmission line) and it can be stuck on, for example.

In the two-part housing SA, U, on one of the front sides of the side walls an encircling gasket is arranged which can be designed as an antenna in ISM 2-range. It is preferably here a groove on the front side of the pad to be foreseen (possible are other forms of the cut) that to serve as an encircling channel UK and where the front side of the housing cap to enter (see FIG. 6 and FIG. 7) and to be fixed through a screwed connection (see FIG. 6 and FIG. 7 screw sleeve GBSA).

For the power supply protection of the controlling device CPU, on the counter Z and/or on the internal optional module Z, IO, on the secondary side of the transformer device Ü or in series in the power supply lines at least one fuse S1, S2 has to be arranged as an optional/retrofit equipment. In addition to this optional/retrofit equipment to the protection of the following parts of the energy counter EZ diagram, on the primary side of the transformer device Ü, at least one thermal fuse S3 has to be arranged (see FIG. 1).

As shown in detail in FIG. 6 and FIG. 7, in a terminal block are arranged single terminals K1a, K1b, K2a, K2b; . . . support AK1; AK2; . . . for the single terminals K1a, K1b, K2a, K2b; ..., shunt S, the connecting catches AZ arranged on it and connecting springs AF fixed over them and/or on the relevant terminal K1a, K1b, K2a, K2b; .... Additionally, the pad U has the shaped partitions T1a, T1b; T2a, T2b; ... between the separate terminals K1a, K1b, K2a, K2b; ... which serve as guides for the cap SAK in L-shape where openings for the bolts SÖ are arranged, so the cap SAK, fixed in the pad U, is always a closed divided with an arm SSAK (see FIG. 8) of the module of the counter Z, chamber GR2 for the relevant pair of terminals K1a, K1b, K2a, K2b; ... (see FIG. 8). The arm SSAK can be arranged in a groove of the lower shell U and fixed to the pad through the securing tabs. The securing tabs can be easily removed with an open cap SA, from the back side which laterally is outside the terminal block K, i.e. also outside the protected area GR2, pressing for example with a metal pin. The shunt S stands upright behind the arm SSAK and is kept in upright position through a counter support/fixing mechanism. With the upright position of the shunt S a compact structure can be implemented more easily. Once the housing is assembled, e.g. opening the housing cap SA and rotating (and sealing) the bolts in the thread bushing GBSA (closing the protected area) of the lower shell U of the housing, it (the housing) can be secured for example on a carrying wall by means of a connecting plate WU which is situated laterally against the terminal module K (whose cap SAK is blocked by the housing cap arranged over it, in this way providing access only to the openings for the bolts SÖ). The housing cap SA catches the cap SAK in such a manner (e.g. a groove or groove-like surface) that it cannot be removed without removing the housing cap SA. Thus the terminal module K falls into the protected area (→GR2) (see also FIG. 8).

Then the cap of the terminal box A, formed as a housing cap, can be fixed for example through screwing the bolts (and sealing) in the screw bushing GBSA of the housing's lower shell U. Thus, the reflector/prism P, arranged in an opening made on the adjoining side, can close the (divided) light guide/interface OSE, and in this case the external modules EO, ER, EKR fall into the protected area (see FIG. 8 GR3). Thus, each attempt for opening the housing cap SA or the cap of the terminal box A will lead to interruption of the interface OSE, and this respectively will be recorded (time, date) (using CPU and a memory).

The connection of the (divided) light guide/interface OSE is chosen to be implemented to one of the internal modules (Z, K, IO, IR) through switching of the connection cable between the internal modules (respectively constructive elements over the printed-circuit-boards LP). On the housing cap SA a control window is arranged. Thus, through the light guide, fixed over the control window, the light from the LED, arranged on the printed circuit board LP of the pad U, can be emitted. In addition, through another light guide, fixed over the control window, D0 interface-D0 is implemented (see FIG. 1) for (remote) reporting of the counter and the measured energy values or the reported values transmission.

Figure 8:
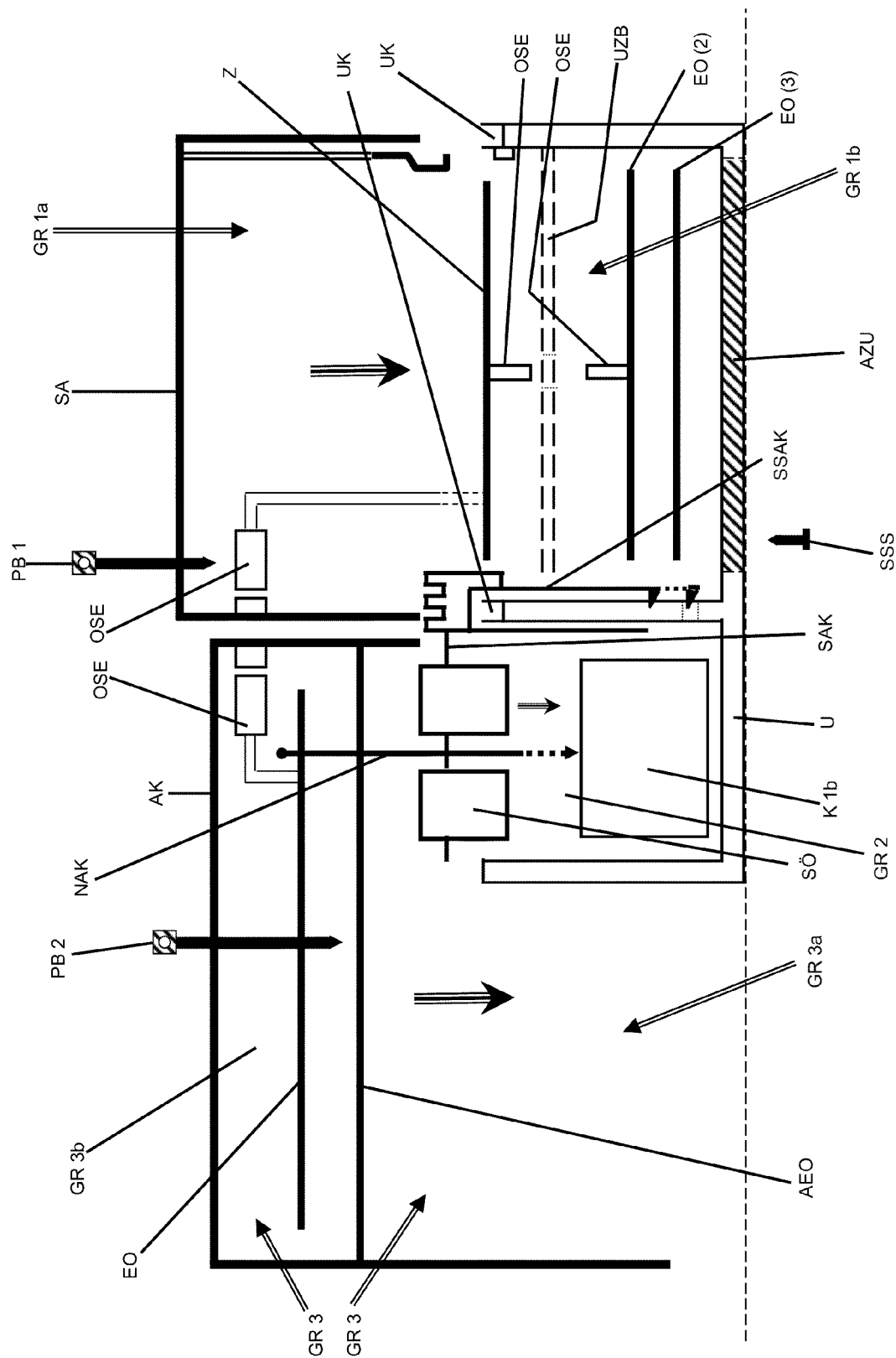

The example for implementation presented in FIG. 8 shows the lower shell U comprising an intermediate base UZB, which divides the protected area GR1 into two protected areas GR1a and GR1b between the housing cap SA and the lower shell U. In the access-protected area GR1a protected with a seal provided by the manufacturer/operator, the module of the counter Z is arranged. Access to the protected area GR1b, where several optional/retrofit modules EO (see FIG. 8: reference 2) can be arranged (see FIG. 8: reference EO (2), EO (3)), is provided through the lower shell U. This allows the customer (operator in measurement points) to add optional/additional modules and to close this area GR1b with the cap AZU, thus access-protecting it. For that purpose, the cap can be secured for example with self-tapping bolts/fixing bolts (e.g. fixing bolts with single side tightening) or boring fixing bolts or through tamping aluminium pins SSS, welding or additional sealing, if needed (the measurement point access is already protected with the installation through screwed connections). In FIG. 8 also the contact NAK for network inclusion is presented, providing access of the optional module EO to the connection point between the network and the terminal module K (in particular, power supply of the external optional module EO, possibly PLC-connection). The contact NAK for network inclusion can be formed as a metal pin. For that reason in the cap NAK it is foreseen for openings to be made which ensure access through the cap SAK to the relevant terminal K1a and K1b. The advantage is that the relevant pin of the contact must have only a minimum clearance because the terminals, in principle, are arranged immovably. On the contrary, when using the opening for the bolts SÖ to access them (bolts), a larger clearance must be foreseen because the depth of their screwing depends on the cable width.

Additionally, FIG. 8 shows the constructive blocking of the cap SAK of the standard terminal module, on the one part through the housing cap SA, and on the other hand through the cap of the terminal box A, AK. Moreover, it shows how through the installation of the terminal cap A, AK a protected area GR3 is formed where the customer (operator in measurement points) can add external modules. It is preferable that in the terminal cap A, AK, after installing the optional module EO, to be arranged one more cover AEO for the external optional module, through which the area GR3 is divided into the parts GR3a and GR3b. If this cover is protected against removal, for example through welding, the access-protected area GR3b gains additional protection (e.g. against manipulations before/during installation), whereas area GR3a is inaccessible only once a partition is installed. Additionally, in FIG. 8 is shown implicitly the hook HSA in the housing cap SA, which catches to the corresponding projections in the lower shell U, thus facilitating installation, respectively reducing the number of bolts required for the seals.

Later, under separate items, once again the individual components of the measuring device/counter EZ according to the invention are described. In the module of the counter Z all phases are potentially divided one from another, moreover, the potential is divided from the digital part (measurement analyzing) and in relation to it the following components are present (see, for example, FIG. 1):

Interfaces:
one transmission and one reception diode for communication (including tamper detection) with an external optional module EO that needs to be retrofitted or usual tamper detection through the prism P, including polling of the blocked line),
one transmission and one reception diode for communication (including Tamper detection).

Supply Voltage
External optional module EO: up to three phases (L1, L2, L3, N) with detection when passing through the phase and neutral,
Internal optional module IO: up to three phases (L1, L2, L3, N) with detection when passing through the phase and neutral, potentially divided low voltage power supply.
Measuring chips for the phases L1, L2, L3 with optoelectronic connecting element for measured values transmission to the controlling device CPU.

MLED (metrological LED) (=pulsing LEDs that emit impulses proportionally to the energy consumed (FIG. 2 see SS2).

Display, as an example LCD-indication (FIG. 2 see SS2).

DO-interface (as per IEC62056-21) for the device counting (remotely) (for displaying the recorded values (with energy values or the reported values measurement)) (FIG. 2 see SS2).

PROG: Programme interface (FIG. 2 see SS2).

EEPROM: for energy values storing and verifying (FIG. 2 see SS2).

From the internal optional module/retrofit module IO several LEDs and push buttons can be controlled, respectively analyzed (in this example, FIG. 1: three LEDs and one push button; FIG. 2 see SS1).

Signalling LEDs and so on, e.g. communication status. Push button, e.g. for reading/browsing the last measured values (FIG. 2 see SS1).

CPU (micro-computer, microprocessor with programme memory):
    Optionally/additionally: signalization with ECC (Elliptic Curve Cryptography) (e.g. see FIG. 2),
    Measurement analysis.

Fuses (optionally/retrofit)
    Fuses 51 on the secondary side of the transformer U along the power supply lines for CPU; for CPU power supply protection,
    Fuses S2 on the secondary side of the transformer U along the internal optional module IO power supply lines; can be removed in the optional module; protect the power supply and thus serve to the readiness of the controlling device, part Z,
    Thermal fuses S13 in the transformer U for protecting the following circuit parts.

The implementation of the terminal module is as a standard terminal module comprising:
    Measuring shunts, measuring transducers or Rogowski coils,
    Connection to the counter power supply, counter module Z,
    Optionally/retrofit: A connection to PLC-inclusion, respectively power supply for the internal optional module IO,
or with optional/retrofit expansion:
    Connection to the internal relay module IR.

The housing in the terminal module K comprises mainly the following features (FIG. 6 and FIG. 7):
    support AK1; AK2: on the lower shell U of the housing supports are located over which terminals K1a, K1b, K2a, K2b; ... are arranged, thus the complete disposal over the lower shell U of the housing is prevented, respectively the heat from the terminals K1a, K1b, K2a, K2b; ... can be lead off,
    Support Shunt AAZ: on the lower shell U of the housing supports are located over which connecting catches are arranged AZ (between them a measuring shunt is located); serve for stabilization,
    counter-support/fixing mechanism FS shunt S: "Domes" on the lower shell U of the housing that fix the connecting catch AZ to the measuring shunt S,
    Fixing mechanisms AAF for connecting spring AF: Supports over the lower shell U of the housing that fix the connecting spring AF,
    Connecting spring AF: fixed to the connecting clamp AZ or to the terminal and provides access to the network connections (L1, L2, L3, N) for the internal module IO (optional module/retrofit module); spring AF serves also for tolerance equalization) based on the components tolerances, temperature variations).

Here the following has to be emphasized:
    Upright shunt S (it allows for better use of the space available),
    Connecting spring AF.

Another components of the measuring device/counter EZ according to the invention is the optional internal relay module IR, subject of retrofit that is controlled by the internal optional module/retrofit module IO (CPU/DSP (DLC-2B)) and serves to disconnect the end customer from the network. It comprises:
    Bistable relay with the relevant controlling components,
    The relays can be switched on individually or collectively (to reduce power; individually, e.g. for switching off a single phase which is connected only to air-conditioners (preferred in the USA).

Also, the internal optional module IO can be optional/retrofitted and it can be described shortly as:
    When preferred, it can serve as a communicational connection of the counter (e.g. PLC-module (1 or 3-phase), for WAN-interface, also for M-bus, ZigBee, GPRS, etc.),
    Through the optical interface OSI, connected with a module of the counter Z (for measured data transmission, parameterization the counter EZ, etc.)
    Can control the internal relay IR, external relay ER, as well as the external optional module EO; for that purpose universal or bi-directional communication is used,
    Comprises AES—and signature module (see FIG. 3 AES) for encrypting the (remote) communication, as described in the not previously published German patent application 10 2008 058 264.6 of the present Applicant which adds to the contents and is based on the present patent application,
    Comprises its own power supply SM,
    Comprises an option of detection when passing through the phase and the neutral (Schmitt-Trigger along the power supply lines SM; see FIG. 1, see FIG. 3 and see FIG. 4)
    Can control the rates.

Also, optional/retrofitted can be the external terminal module and module EO providing expansion options (arranged in the terminal cover A formed as a cap of the housing) which can be described shortly as:
    Cover A which can be arranged over the terminal module (by the way, as access-protected network leads conducting electric current), when preferred, can serve to integrate additional functional elements because it saves space,
    It can serve, for example, as a communicational connection of the counter EZ (e.g. PLC-module 10 (1 or 3-phase), for internal communication in the building, M-bus, ZigBee, GPRS, etc.),
    Serves for connecting via interface OSE with counter Z,
    Via interface OSE unauthorized manipulations can be easily recognized (opening the terminal cap A) (e.g. at regular communication),
    Comprises (see internal optional module IO) an AES- and signature module AES for encrypting the (remote) communication (e.g. see FIG. 3),
    Comprises (see internal optional module IO) its own power supply SW,
    Comprises (see internal optional module IO) an option for recognizing phases,
    Can be used for controlling the rates (see internal optional module IO).

Also, optional/retrofitted can be the external terminal module+relay module EKR (external relay+optional module in the terminal cover A formed as a cap of the housing) which can be described shortly as:

In its essence the optional module EKR conforms with the external optional module EO in the cap of the terminal box AK, Additionally, the optional module controls the relay/relays, The relay coil, when preferred, can be used for power supply SW in the external terminal module+relay module EKR, then no additional transducer is necessary.

Relay:
Disconnecting from the network,
Reducing power.

The terminal boxes caps can be equipped as follows:

Standard terminal box cap:
No additional function.

A terminal box cap with tamper detection function (=terminal box cap A, AK):
Usually it is implemented a higher one in comparison with the standard terminal box cap and is equipped with a prism R for tamper detection; prism R serves as a reflector for optical interface OSE to the module of the counter Z, It can be expanded with a terminal module and expansion module EO (external optional module in the terminal box cap A, as described above), in this case on the reflector's place the opposite side for the optical interface OSE is arranged to the module of the counter Z, i.e. relevant transmission and recerpion diodes and implementation as a shared optical interface.

In principle, within the invention, any combinations of the different modules are possible, only the option/retrofit of internal and external relay module IR and ER is mutually exclusive, respectively, it is actually not reasonable because the relay is needed only once. The features of the measuring device/counter EZ according to the invention are as follows:

An external terminal and relay module EKR, arranged in the terminal block, makes later extension of the EZ counter with relays possible with an easy extension (installation) on site; the terminal and relay module EKR enables outside (favorably) the standard terminals again.

An external relay module ER with an integrated communication and option module EO (with optical connection).

A reflector (a prism P) to the optical tamper detection in the cap of the terminal box A, i.e. the tamper detection is achieved by the optical line; Reflector P forwards the received signal from the optical transmitter of the counter module Z back to its optical receiver (→transmission-reception cycle); the opening of the counter Z interrupts the optical line; this can be counted in the Z counter module by regular monitoring of the interface OSE.

The relay coil (in the terminal and relay module) can be used simultaneously as a transmitter for power supply of the existing option module EO, i.e. there is no need of special transformer.

A connection of the internal option module IO through a contact spring AF which is fixed by the connecting gag AZ, e.g. by welding.

Terminal block:
It is integrated in the terminal,
It performs up to four functions simultaneously in an optimal way:
Network connection,
Contact for the option module, i.e. access for switching on internal and external modules into the network,
Shunt connection for the option module or connection for the transducer or the Rogowski-coil/coils,
Adapting the PLC-board (integrated in terminals), i.e. interface for the PLC-board to the network (for PLC-communication).
Constructive blocking of a SAK cover of the standard terminal module via the housing cap and the terminal box cap (A, AK).

Summarizing, the measuring device/counter EZ according to the invention reveals the following advantages:

An optimized solution/implementation of new/additional features, i.e. beneficial in terms of costs, compact, flexible solution, easy installation.

An integrated terminal (as a central connection), several simultaneous functions:
Network connection,
Measuring via S Shunt or transducer or Rogowski coil,
Adapting (contact) for the internal option module IO (PLC; especially DLC-communication), i.e. PLC-board interface to the network,
Adapting for a (external or internal) relay module ER, IR,
Adapting for the external option module EO (an additional module in the cap A, AK).

Optical interface to the terminal box cap:
Opening detection of the cap (=terminal box cap A, AK) or the housing cover SA via reflector P, respectively via normal communication throughout the optical interface OSE to the external option module (i.e. easy implementation for tamper detection),
Simultaneous communication throughout the optical interface OSE/OSI, i.e. there is no need of extra communication costs for tamper detection,
Easy testing of the interface via the reflector P (during the process of production).

Separating of the potential via separate neutrals in the system, therefore, independent modules (phases, a counter, analysis); the measuring part is potentially separated from the controlling one, distortions of the potential and the mass are not possible, the connection consists of the optical lines OSI, OSE only. Thus, the security is increased including release from an adverse impact and electromagnetic compatibility is also possible.

Modules concept:
The counter EZ can be assembled from modules according to needs, respectively, the standard variants can be prepared in advance; in case of the customer needs changes, the functionality can just be updated. It is possible without energy meter dismounting, but only by replacing or adding modules.

As a basic potential for the measuring electronics of the phase path the relevant phase is used (i.e. measuring system neutrals refer to the relevant phase), thus the measuring is more precise and the malfunctions prevention is better.

Failure of the primary side do not affect the secondary one and vice versa (better electromagnetic compatibility).

High disconnecting voltages due to the relevant structure of the printed circuit board LP (respectively several arranged one above another printed circuit boards) and the housing (printed circuit board LP is fixed to the lower shell U via locking pins RNLP) as well as possibility for insulation stability, for example 12 kV, lightning protection, which is important in areas where overhead power lines predominate.

Central power supply is throughout the counter module Z, thus there is no need of extra power supply for option modules and the power loss in the system is minimal.

Through mechanical blocking of the relays, accidental or impermissible (legal regulations) switching off the end user can be prevented.

Easy and safe installation of the relay block by one person, i.e. the relay block can be fixed before bolting by appropriate mechanical means (for example a locking mechanism or a tight fit).

Bistable relays use (thus high power loss is prevented as opposed to monostable ones).

Relay coil (in the terminal and relay module) can be used simultaneously as a transformer for an existing option module, there is no need of a special transformer.

The customer number, respectively the registration number of the measure point are marked on the intelligent cap A (or SA), wherefore the change of the measure point operator requires only a change of the cap A with the relevant features (because the customer number is important in counting, i.e. as well as in the registration. This must be done by authorized persons, representatives of the both parties).

Central power supply as a source of modules independent power, i.e. the central terminal block enables network access; therefore there is no need of additional access or battery. Therefore, in the case of preference of the cap SAK, the holes in the terminal module K enable access to terminals K1$b$. K2$b$, . . . of the protected area GR3.

It should be emphasized that within the scope of the invention, the communication between the retrofitted modules is feasible, for example between the terminal module and the extension module EO, or the internal option module IO, by the standard measuring device (basic counter) (see FIG. 2) or it is realized in descending order through the optical lines where there is a possibility for galvanic separation on one hand, and on the other, the reverse effect onto the measuring device/energy counter (EZ) is reliably prevented, i.e. although the module, extendable design, retrofit options, the impossibility of unauthorized manipulation is guaranteed. If due to abusive manipulations of any person, for example, a short-circuit occurs in the terms of the invented concept, the result is segmented destruction only, namely the internal part of the network and that is recorded. A main point of the invented measuring device/energy counter (EZ) is the receiving of a stable, unchanged (1:1) signature/telegram through the optical lines, via the reflector R (ECC, respectively AES- and signature module, see, for example, FIG. 2 and FIG. 3) or, in the presence of relevant equipment—a reply, too (for example, for an expected moment of the time) (for example, a telegram receipt).

The invention is not limited to the described and presented examples of implementation but it also covers all implementations being equivalent in the sense of the invention. In the context of the invention, the measurement device, in particular modular energy meter EZ according to the invention can also be used by a device subject to the not previously published German patent application 10 2008 058 264.6 of the present applicant, namely a measurement device, which communicates data to at least one system, and which has the capability of identifying measurement data returned by the system via the data communication as its own, and the capability to rule out manipulation of measurement values and to thus provide this returned measurement data reliably for further processing/evaluation or displaying, which comprises:

at least a communication interface to components of a system, which at least has the capability of receiving signed and or encrypted measurement data, storing said measurement data in a memory and delivering back, and has the capability of offering time information related to a time reference, at least a measuring module, which assigns measurement signals to energy measured values or counts supplied by at least one sensor, at least a memory for a measurement value, said measurement value being the last determined energy measured value or count (short named: measurement value), at least a memory for a time stamp, which in the time module was determined for the last generated measurement value, at least a time adjustment module, which checks and adjusts the time, offered by said communication interface of the system, to the local time of the time module, at least a memory for the identification assigned to said measurement device, at least a memory for one or more of the keys required for encrypting and/or signing at least an encryption and/or signature encoder that supplies, using the key in said key memory, the information offered to the aforementioned memories, including the validity and reliability identifier having information for inspecting the integrity of the data, compiles said information into a current data set and transfers it to at least said communication interface for transfer, at least an encryption and/or signature decoder that can inspect the data sets returned via the communication interface using the key in said key memory for integrity of the data content and the identification of the measurement device and upon successful inspection of this data supplying said data for further processing or evaluating or displaying.

An advantage of the measuring device/counter EZ according to the invention is that the manufacturer can adapt it in accordance with the customer's individual needs (e.g. network operator) in the easiest and most profitable way and according to the needs to equip it with one (or more) communicational modules. On the contrary of the present level of technical development, thus different variants can be easily implemented on the grounds of the basic measuring device which has more opportunities for application which results in increased sales and the counters are more profitable. If at the present level of technical development, for example, one single-phase connection to the energy network is introduced always at phase L3, contrary the measuring device/counter EZ according to the invention—according to needs—an optional module/retrofit module can be integrated, for example, with single-phase or three-phase connection.

Besides this, the invention has so far not been limited by the defined combination of claimed features according to the patent claims and can also be defined through any other combination of certain features of all disclosed individual features. This means that each individual feature according to the patent claims may be omitted, respectively, at least to be replaced by an individual feature disclosed at another place in this application.

The invention claimed is:

1. A modular energy meter, comprising:
a two-part housing comprising a cover and a lower shell, said cover and lower shell being detachably connectable to each other to define a sealed, access-protected portion and a non-sealed portion; and
a window provided in said cover, said window forming an interface compliant with IEC 62056-21 for remote reading of an energy measurement or a counting value;

wherein an internal module comprising at least a counter module and a terminal module is arranged in the sealed, access-protected portion of the housing, wherein an external module comprising at least an extension module is arranged in the non-sealed portion of the housing, wherein at least one optical interface is arranged in the internal module and at least one associated optical interface is arranged in the external module, said optical interfaces cooperating to permit communication between the internal module and the external module, and wherein the modular energy meter further comprises a reflector arranged between said optical interfaces, said reflector interrupting an optical path between said optical interfaces upon opening of the sealed, access-protected portion thereby permitting detection of the opening of the sealed, access-protected portion.

2. The energy meter according to claim 1, wherein the terminal module comprises a terminal block for network connection, for connecting a power supply to the internal and/or external modules and for connecting at least a shunt resistor, a transducer or a Rogowski coil.

3. The energy meter according to claim 2, wherein an option/retrofit module is arranged in said sealed, access-protected portion for communication connection of the modular energy meter for bi-directional data communications, including remote reading of encrypted data via said terminal module into a power supply network and to a central station.

4. The energy meter according to claim 3, wherein the internal option/retrofit module comprises a further optical interface for bidirectional data communication with an external option/retrofit module.

5. The energy meter according to claim 2, wherein an internal relay module is arranged in said sealed, access-protected portion and connected with the terminal module, which at least comprises a bistable relays actuated by an internal radio module and which is used for separating a customer from or shutdown of individual phases of the power supply network.

6. The energy meter according to claim 2, wherein the counter module comprises a transformer whose primary side is connected to the terminal module and whose secondary side is connected to a control unit of the counter module for evaluation, identification and displaying the supplied measuring signals, and wherein the secondary side is also connected to a voltage converter arranged in the internal or external modules.

7. The energy meter according to claim 2, wherein an external relay module is attached at the terminal block for subsequent expansion of the counter.

8. The energy meter according to claim 7, wherein the external relay module has a communication-/option module with optical connection to said counter or an internal option module.

9. The energy meter according to claim 2, wherein in a housing cap formed as a terminal cover, a terminal and expansion module is arranged as an external option retrofit module with optical connection to the counter module or an internal option/retrofit module or the reflector.

10. The energy meter according to claim 9, wherein the reflector is formed as a prism.

11. The energy meter according to claim 9, wherein a customer number and/or a counting point name is stored in a memory of an integrated external optional module of the terminal cover.

12. The energy meter according to claim 2, wherein the terminal module has a separate cover.

13. The energy meter according to claim 1, wherein the two-part housing comprises a gasket arranged circumferentially around at end faces of side walls.

14. The energy meter according to claim 6, wherein to protect the power supply to the control unit of the counter module and/or an internal option module at least a fuse is located on the secondary side of said transformer or subsequently in power supply paths.

15. The energy meter according to claim 6, wherein at least a thermal fuse is arranged on the primary side of the transformer to protect subsequent circuit components of the energy meter.

16. The energy meter according to claim 2, wherein the connection block consists of single terminals, supports for the individual terminals and the shunt resistor, and connecting tongues resting at the connection block and connector springs attachable to it and/or to the respective single terminal.

17. The energy meter according to claim 1, wherein via to the window fixed light guides, the light from on a printed circuit board arranged LEDs located in a lower shell is radiated.

18. The energy meter according to claim 12, wherein the lower shell comprises molded partitions between each individual terminal, which are used as guides for L-shaped formed and screw holes containing the cover, so that by said cover latched at the lower shell for each terminal pair a closed chamber bordered by a leg versus the counter module is formed.

19. The energy meter according to claim 16, wherein the shunt resistor stands on the supports and is guided through the partition.

20. The energy meter according to claim 1, wherein the connection of the optical interface to one of the internal modules takes place by replugging a cable between the internal modules.

21. The energy meter according to claim 13, wherein said gasket arranged circumferentially around at the end face of the side walls is designed as an antenna for an ISM band.

22. The energy meter according to claim 12, wherein the cover of the terminal module has cutouts, which allow from the sealed, protected-access portion to individual terminals.

23. The energy meter according to claim 3, wherein the internal option module and/or the external module option serves for bidirectional data transmission over a wired or wireless network.

24. The energy meter according to claim 1, wherein the lower shell contains an intermediate base, which separates from a bottom of the lower shell and cover a protected area for the attaching of at least one other external option/retrofit module.

25. The energy meter according to claim 24, wherein the intermediate base contains corresponding recesses for at least one external interface to at least an external optional module attached within the protected area.

26. The energy meter according to claim 11, wherein the terminal cover comprises an additional cover mounted so that for the external option module another protected area is formed.

27. The energy meter according to claim 2, wherein a relay coil in the terminal and relay module at the same time serves as a transformer for the power supply of an option module embedded in said terminal and relay module.

28. The energy meter according to claim 12, wherein the housing construction is designed such that the cover of the terminal module is both locked by the housing cover and the terminal cover.

29. The energy meter according to claim 1, wherein the connection of the optical interface to one of the internal modules is switched by an electronic multiplexer.

30. The energy meter according to claim 1, wherein the two-part housing has at the end faces a circumferential channel.

31. The energy meter according to claim 1, wherein the circumferential channel continues in the cover.

\* \* \* \* \*